United States Patent [19]

London

[11] 3,903,406

[45] Sept. 2, 1975

[54] ACOUSTIC WAVE CORRELATOR CONTROL CIRCUITRY

[75] Inventor: Arnold London, Tempe, Ariz.

[73] Assignee: Motorola, Inc., Chicago, Ill.

[22] Filed: Oct. 9, 1973

[21] Appl. No.: 404,545

[52] U.S. Cl. .................... 235/181; 310/9.8; 333/72; 357/26; 357/41

[51] Int. Cl.[2] ........................ G06G 7/19; H03H 9/02

[58] Field of Search ............ 235/181; 307/303, 305, 307/213; 310/8.1, 9.8; 357/26, 41; 333/30, 70

[56] References Cited

UNITED STATES PATENTS

| | | | |
|---|---|---|---|
| 3,551,837 | 12/1970 | Speiser et al. | 310/9.8 |
| 3,675,163 | 7/1972 | Hartmann et al. | 310/9.8 |
| 3,678,401 | 7/1972 | Adler | 307/303 |
| 3,755,761 | 8/1973 | Hartmann | 310/8.1 |

OTHER PUBLICATIONS

Collins et al., Surface Wave Delay Lines Promise Filters For Radar, Flat Tubes and Faster Computers p. 110/122 from Electronics Vol. 43 Jan. 19, 1970.

*Primary Examiner*—Felix D. Gruber
*Attorney, Agent, or Firm*—Vincent J. Rauner; Charles R. Hoffman

[57] ABSTRACT

Control circuitry is described for use in a multiphase wave correlator device. First and second electron control circuitry are coupled, respectively, between first and second signal conductors and piezoresistive detector circuitry. The first and second signal conductors are coupled, respectively, to first and second output terminals and also to first and second load circuitry. Control electrodes of the first and second electron control circuitry are coupled, respectively, to input and output terminals of phase reversal circuitry. The number of required piezoelectric detector circuitry is reduced by a factor of two as a result of providing the phase reversal control circuitry and the first and second electron control circuitry according to the invention. The number of electrical connections required to control the piezoresistive detectors is reduced as a result of this control circuitry.

8 Claims, 6 Drawing Figures

ACOUSTIC WAVE CORRELATOR CONTROL CIRCUITRY

BACKGROUND OF THE INVENTION

It is well established that surface acoustic waves on silicon and similar semiconductor materials may be detected by means of arrays of metal-oxide-silicon field effect transistor (MOSFET) detectors or other insulated gate field effect transistor (IGFET) detectors. Systems incorporating surface acoustic wave generation and detection have been found to be useful in the communications industry as a means of signal decoding, signal compression, etc. In an acoustic wave matched filter or correlator circuit it is necessary to determine phase differences between successive bits in the acoustic wave. This has been done by providing one MOSFET detector per bit for each phase. For example, for a quadraphase correlator circuit 32 bits in length, 4 times 32, or 128 MOSFET detectors are required. This can be accomplished by positioning two rows of 32 MOSFET detectors on each side of an acoustic wave transducer, so that each of the four rows can detect a phase shift of 0, $\pi/2$, $\pi$, $3\pi/2$ radians of the frequency generated by the input transducer. This may be a zinc oxide interdigitated device on a silicon substrate. This circuit has a number of shortcomings. For example, a considerable amount of unused chip space exists between the MOSFET detectors. Further, the positioning of an array on each side of the piezoelectric transducer causes the chip to be quite large and increases the difficulty of aligning the detectors the correct distance therefrom, for conventional photolithographic techniques which are used to define the device positions. Further, the capacitance from the signal conductor, to the drain electrodes of all of the MOSFET detectors is high, limiting the frequency response of the device. A total of 128 external electrical connections is required to properly control the detectors in the circuit.

In an acoustic wave correlator device, a sinusoidal voltage applied across the piezoelectric transducer film on the silicon substrate imports a sinusoidal acoustic surface wave to the substrate, which propagates away from the transducer at a velocity determined by the temperature, crystal orientation, and surface conditions of the structure.

SUMMARY OF THE INVENTION

Briefly described, the invention provides a phase reversal control circuit and detector switching circuitry in an acoustic wave correlator device. The detector switching circuitry controllably switches a piezoresistive detector to one of first and second signal conductors. Each of the first and second signal conductors is coupled to a corresponding load device, which is in turn coupled to a reference voltage source. The output voltage of the device is measured between the first and second signal conductors. The piezoresistive detector is coupled either to the first signal conductor by the phase reversal control and detector switching circuitry to detect an anticipated first phase-coded acoustic signal, or is coupled to the second signal conductor by the phase reversal control and detector switching circuitry to detect a second anticipated phase-coded acoustic signal which is $\pi$ radians out of phase with the first phase-coded acoustic signal. In one embodiment, MOSFET detectors and MOSFET detector switching circuitry and phase reversal control circuitry and code selection circuitry are provided on a silicon substrate. The wave motion of the silicon surface induces a piezoresistive effect in the silicon, which modifies by a certain amount the surface mobility of the silicon. Thus, a D.C. current flowing through a MOSFET detector in the path of the surface acoustic wall will undergo a corresponding sinusoidal variation as the acoustic surface wave passes through the channel region of the MOSFET. MOSFET detectors which are connected in parallel and are spaced apart by an integral number of wavelengths will have a current variation therein which adds in phase. However, if the MOSFETs detectors are spaced by a non-integral number of wavelengths, the sinusoidal current variations will not add in phase, and will tend to cancel.

Since a large number of relatively widely spaced MOSFET detectors are required for prior art correlator devices, a need exists for more efficiently utilizing the surface area of the silicon substrate to reduce the cost thereof. Further, in prior art correlator devices, the drain-to-gate and drain-to-substrate capacitance of all unselected MOSFET detectors is coupled to the signal conductor, deleteriously affecting the frequency response of the device. A need also exists to reduce the number of electrical connections to the circuit and still insure proper performance.

It is an object of the invention to provide improved acoustic wave correlator circuitry with a reduced number of detectors and corresponding reduced substrate area.

It is another object of the invention to provide improved control circuitry in an acoustic wave correlator device.

It is another object of the invention to provide monolithic MOSFET phase reversal control circuitry and detector switching circuitry in an acoustic wave correlator device.

DESCRIPTION OF THE INVENTION

Figure 1:
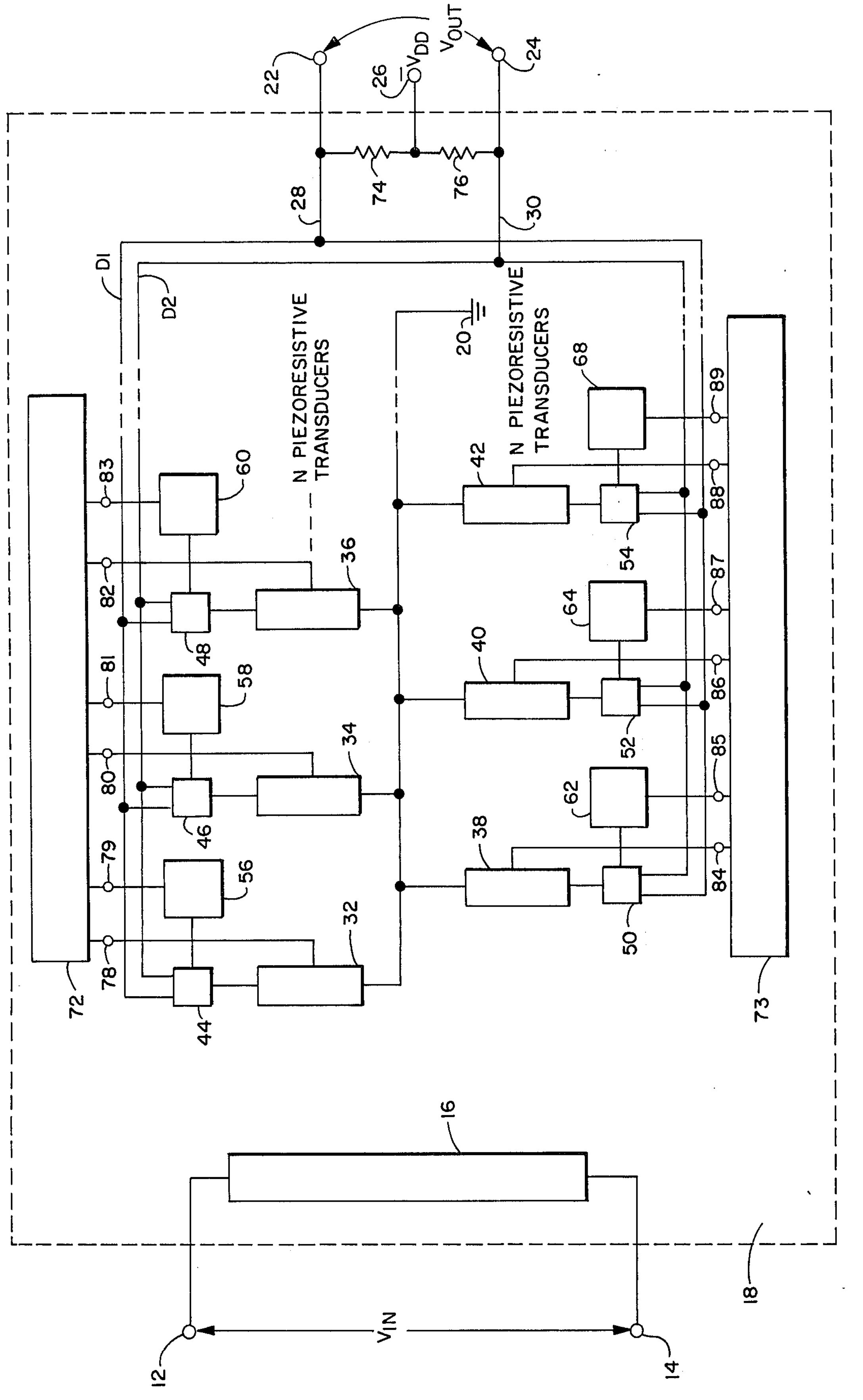
FIG. 1 is a block diagram of an acoustic wave correlator circuit according to the invention.

A block diagram of acoustic surface wave correlator 10 is shown in FIG. 1. The dotted outline symbolically designates a portion of a surface 18 of a substrate, which may be silicon having a crystal orientation known to give high piezoresistive response. Acoustic wave correlator 10 has input terminals 12 and 14 connected to a piezoelectric transducer 16, which may be a zinc oxide film upon which is an interdigitated metal pattern. This structure may be upon a silicon dioxide layer which covers silicon surface 18. A voltage $V_{IN}$ may be applied between input terminals 12 and 14. Acoustic wave correlator 10 has output terminals 22 and 24, and first and second voltage supply terminals 26 and 20 adapted to be connected to an external power supply.

A plurality of piezoresistive detectors including piezoresistive transducers 32, 34, 36, 38, 40 and 42 are provided on surface 18. These piezoresistive detectors (hereinafter simply called detectors) may be MOSFET devices, and are positioned as shown in first and second rows. MOSFET detectors 32, 34 and 36 are positioned in the top row along surface 18 so that their channel regions are spaced by an integral number of wavelengths, where the wavelength referred to is the ratio V/f, where V is the velocity of propagation of the surface acoustic wave in the substrate material and f is the operative carrier frequency of a sinusoidal input signal $V_{IN}$ applied to terminals 12 and 14. (The channel region of a MOSFET device is the semiconductor region immediately beneath the gate insulator between the source and drain regions thereof and its length is made small with respect to the acoustic wavelength). Similarly, MOSFET detectors 38, 40 and 42 are positioned in the bottom row, wherein the active channel regions of the detectors are spaced an integral number of wavelengths apart. Further, the detectors in the bottom row are shifted horizontally with respect to those in the top row by an amount corresponding to a $\pi/2$ radians phase shift of the acoustic surface wave generated by transducer 16. It is clear from the drawing in FIG. 1 that each row can have any number N of detectors therein.

Each of the detectors 32, 34, 36, 38, 40, 42, etc. has one terminal connected to second voltage terminal 20 (voltage terminal 20 is also connected to the silicon substrate in which the detectors are fabricated), and each has a second electrode connected to a detector switching circuit, herein also simply called a switching circuit. Specifically, detectors 32, 34, 36, 38, 40 and 42 each have a second terminal connected, respectively, to detector switching circuits 44, 46, 48, 50, 52 and 54. Acoustic wave correlator 10 further includes control and code selection circuitry 72, 73, which may include a read only memory, coupled to control terminals 78, 79, 80, 81, 82, 83, and also to control terminals 84, 85, 86, 87, 88, and 89, respectively the precise circuitry required in the control and code selection circuitry 72, 73 depends on the particular code desired and upon the external circuitry with which the circuitry 72, 73 must be interfaced. A general discussion of logic circuitry and methods of deriving it for specific requirements is given in Logical Design of Digital Computers by Montgomery Phister, John Wiley and Sons, Inc., 1958.

Detectors 32, 34, 36, 38, 40 and 42 have main electrodes coupled, respectively, to control terminals 78, 80, 82, 84, 86 and 88.

Detector switching circuits 44, 46, 48, 50, 52 and 54 are coupled, respectively, to phase reversal circuits 56, 58, 60, 62, 64 and 68. Each of the detector switching circuits 44, 46, etc. are connected to first and second signal conductors 28 and 30, which are adapted to be coupled to output terminals 22 and 24, respectively. Load device 74 is connected between output terminal 22 and first voltage terminal 26, and load device 76 is connected between output terminal 24 and first voltage terminal 26. Phase reversal circuits 56, 58, 60, 62, 64 and 68 are coupled, respectively, to control terminals 79, 81, 83, 85, 87 and 89. It is clear from FIG. 1 that each detector in a particular row is coupled to the code selection circuitry 72, 73, and also is coupled, respectively to a single detector switching circuit and to a single phase reversal circuit.

Control and code selection circuitry 72, 73 may be positioned on the substrate surface 18 in a divided fashion as shown in the block diagram of FIG. 1, or may be otherwise distributed on the surface 18.

The acoustic wave correlator 10 in FIG. 1 is a quadraphase acoustic wave correlator. If there are N piezoresistive detectors in each of the two rows, then the device is an N-bit quadraphase acoustic wave correlator device. Referring to the first bit in the first row, a schematic representation of the circuitry which may be used for transducer 32, switching circuit 44, and phase reversal circuit 56 is shown in FIG. 3.

Figure 2:
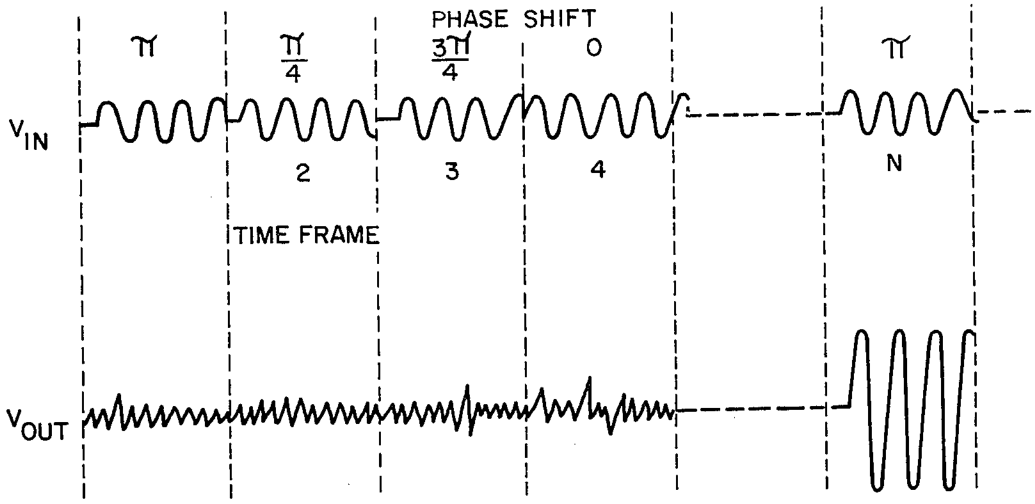
FIG. 2 is a diagram illustrating an input waveform which may be applied to the acoustic wave correlator circuit of FIG. 1 and a correlation signal at the output terminals thereof.
Figure 3:
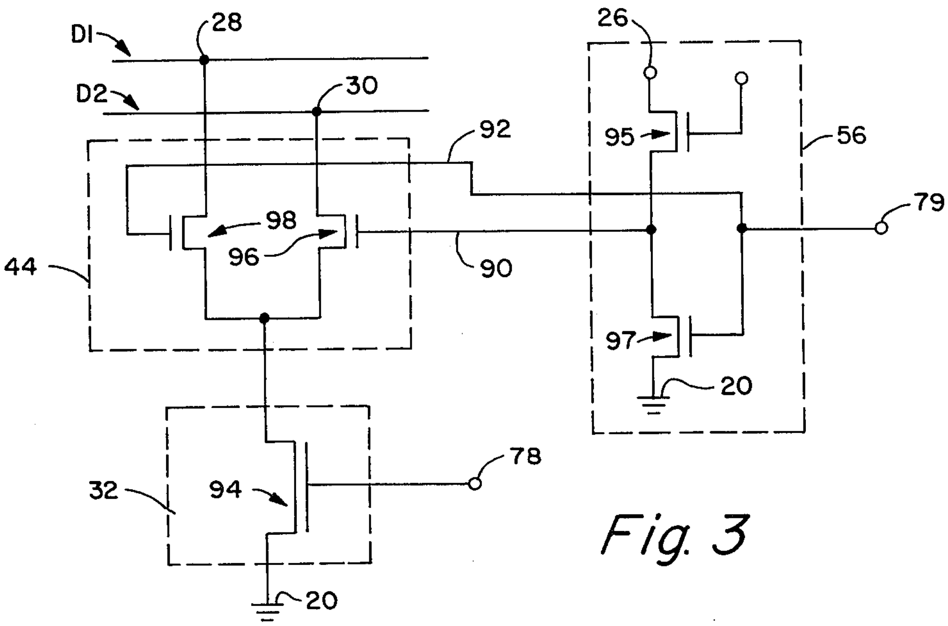
FIG. 3 is a schematic diagram describing several of the blocks of the diagram of FIG. 1.
Figure 4:
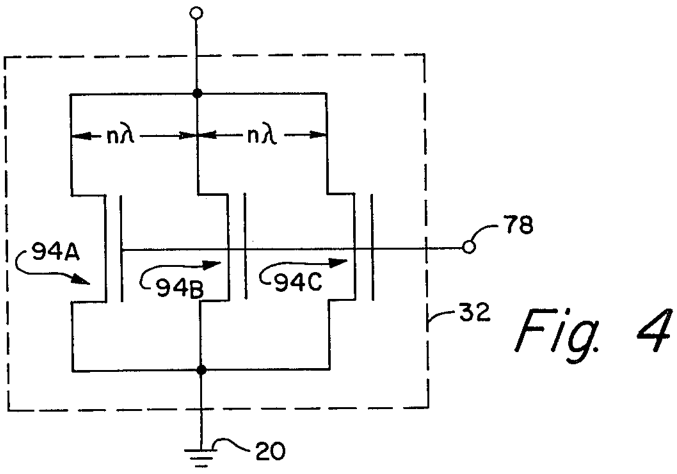
FIG. 4 is a schematic diagram of a MOSFET detector configuration which may be used in the embodiment of FIG. 1.

Referring now to FIG. 3, it is seen that piezoresistive transducer 32 may be a MOSFET 94 having its gate electrode connected to control terminal 78, its source connected to voltage terminal 20, and its drain connected to switching circuit 44. Or, alternatively, as shown in FIG. 4, detector 32 may consist of a plurality of MOSFET devices 94a, 94b and 94c connected in parallel and having their channel regions each spaced an integral number of wavelengths from the others. Typically, each of these detectors will be spaced a single wavelength from adjacent detectors and the total number of detectors per bit will be less than the number of cycles in each bit of the input wave shown in FIG. 2.

Referring back to FIG. 3, it is seen that switching circuit 44 includes MOSFETs 96 and 98 having their source electrodes connected to the drain electrode of MOSFET detector 94. MOSFETs 96 and 98 have their drain electrodes connected, respectively, to first and second signal conductors 28 and 30, respectively. It is seen that phase reversal circuit 56 includes MOSFETs 95 and 97 connected in series between voltage supply terminals 26 (or another terminal connected to a more optimal voltage) and 20. MOSFETs 95 and 97 form a conventional MOSFET inverter, having its input electrode connected to control terminal 79, which is also connected to conductor 92 which in turn is connected to the gate of MOSFET 96. The output of the MOSFET inverter is connected to conductor 90, which is connected to the gate electrode of MOSFET 98.

Figure 6:
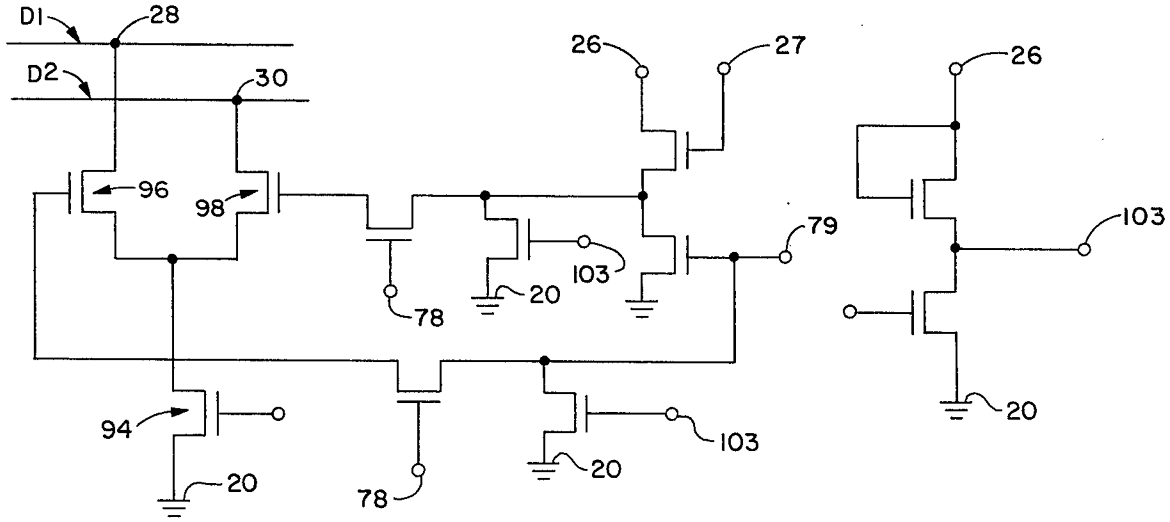
FIG. 6 is a schematic diagram of a phase reversal circuit which decouples an unselected MOSFET detector from the signal conductors.

Load MOSFET 95 may have its gate electrode connected to voltage terminal 26 ($V_{DD}$ in FIG. 1) or to a different voltage terminal, not shown. Further, phase reversal circuit 56 may be a complementary MOSFET inverter, wherein MOSFET 95 is an N-channel device and MOSFET 97 is a P-channel device, the two having their gate electrodes connected together. In another embodiment, shown in FIG. 6, an additional inverter and two series switching MOSFETs are provided to insure that MOSFETs 96 and 98 are always off when detector MOSFET 94 is off. This scheme provides the advantage of disconnecting the drain-to-gate capacitance of detector MOSFET 94 from signal conductors 28 and 30 for unselected MOSFET detector devices. It also reduces to 2 the number of external leads required to select which of four phases will be detected.

Figure 5:
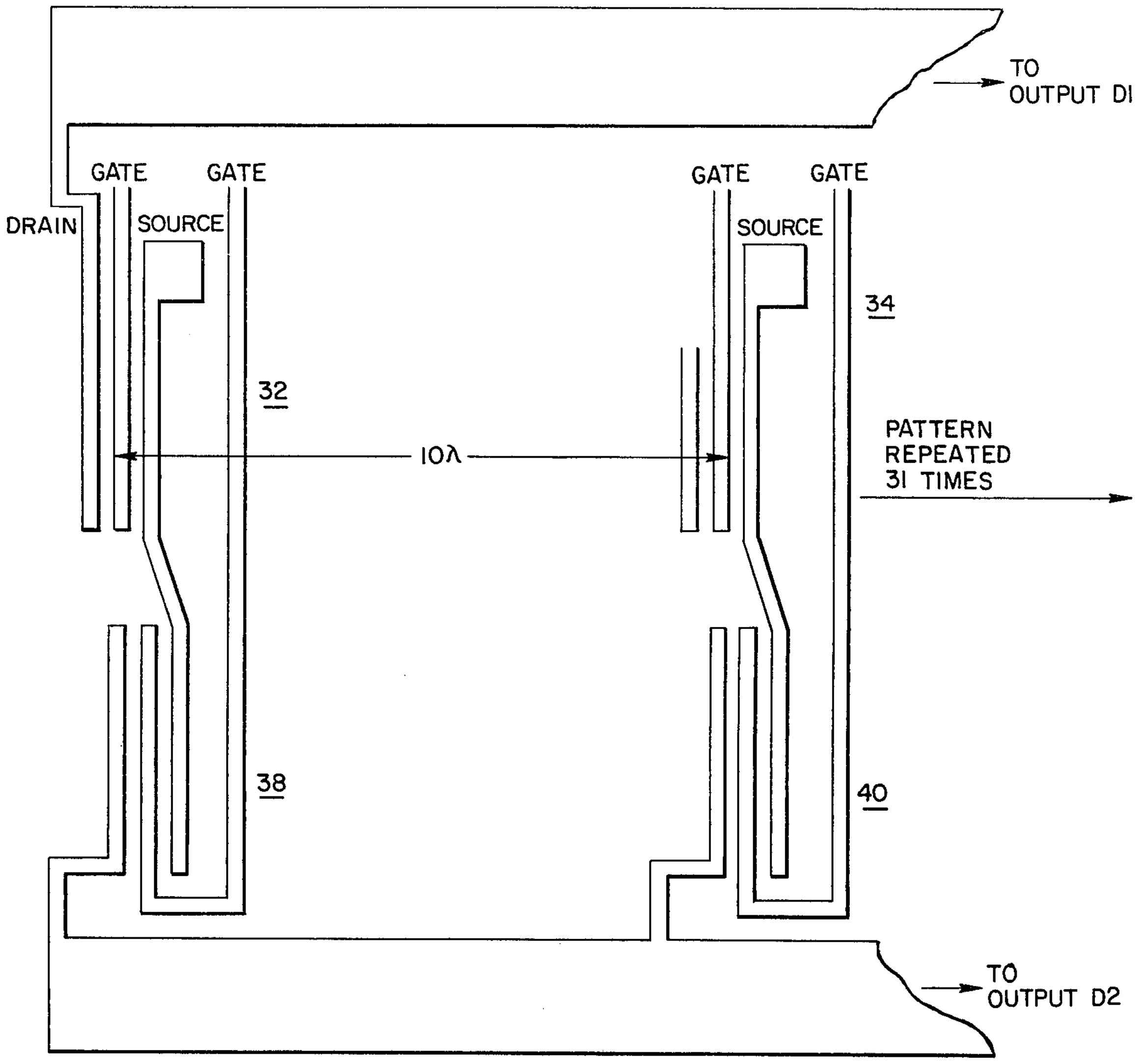
FIG. 5 depicts an advantageous layout scheme for MOSFET detectors used in an acoustic wave correlator device.

Referring to FIG. 5, a plan view of a convenient layout of an MOS implementation of detectors 32 and 34 and 38 and 40 is depicted.

Those skilled in the art will recognize that MOSFET devices such as those utilized in the circuitry and as piezoresistive detectors as described herein have two main electrodes, and a control electrode. The control electrode is the gate electrode of the MOSFET, and the two main electrodes may alternately function as either source or drain electrodes, depending on the relative voltages thereof. In the description and in the appended claims the terms source and drain are used to designate a particular electrode, but not necessarily the function of that electrode during circuit operation, since the function may vary during circuit oepration.

The ways in which the inventive acoustic wave correlator of the invention distinguishes over those of the prior art will be more clearly understood after reading the following description of the operation of the invention.

FIG. 2 illustrates a typical phase-coded sinusoidal waveform $V_{IN}$ which may be applied to the input terminals of acoustic wave correlator 10. The phase-coded information may be provided, for example, at a 10 MHz data rate on a 60 MHz carrier. Then, for an N-bit acoustic wave correlator, the input waveform is divided in N time frames of 100 nanosecond duration, each of which may be shifted in phase by zero, $\pi/2$, $\pi$, or $3\pi/2$ radians. The electrical input signal is coupled to piezoelectric transducer 16, which imparts a phase-coded sinusoidal surface wave pattern on surface 18 in FIG. 1, which surface wave pattern propagates toward the array of MOSFET detectors. Since, as explained previously, the MOSFET detectors are piezoresistive elements, the acoustic wave pattern can modify the surface conductivity by as much as several percent if the substrate is silicon with an appropriate crystal orientation, and consequently the current flowing through a given MOSFET detector varies sinusoidally, responsive to the sinusoidal acoustic wave pattern propagating through its channel region. Thus, a sinusoidal, phase-coded representation of the input pattern is produced in the incremental variation of the current through each MOSFET detector as the acoustic wave propagates through its channel region. Since the MOSFET detectors in the first row (detectors 32, 34 and 36, for example) are positioned so that their channel regions are spaced an integral number of wavelengths apart, if they are connected in parallel by the action of switching circuits 44, 46 and 48 and phase reversal circuits 56, 58 and 60, then the phase-coded sinusoidal variation in the currents will add and will flow through the connected signal conductor and through the appropriate load device, causing a phasecoded voltage variation at $V_{OUT}$.

The duration of the various time frames is equal to the time required for the acoustic surface wave to propagate from the channel region of one of the N detectors to that of another.

The purpose of the N-bit acoustic wave correlator is to recognize a particularly coded N-frame sequence of the input signal $V_{IN}$, and to give a detectably large alternating current voltage signal $V_{OUT}$ upon recognition. Recognition will occur when the wave has travelled sufficiently far from input transducer 16 to appear spatially under all N detectors simultaneously.

As previously mentioned, if a number of MOSFET detectors coupled in parallel (either connected directly or coupled by a controlled switching device) are spaced apart by an integral number of wavelengths, the current variations induced by a continuous sinusoidal surface wave of the corresponding frequency will tend to add in phase. However, if the MOSFET detectors are spaced by a non-integral number of wavelengths, the alternating current variations produced by the same wave will not add in phase, and may in fact cancel. In the prior art quadraphase acoustic wave correlator previously discussed, detection of a phase-coded signal having therein information represented by one of four phase shifts within each time frame is detected by providing four quadrants of detectors, each including a row of N MOSFET detectors spaced an integral number of wavelengths apart. The drain electrodes of all four MOSFET detectors are connected to a single signal conductor which is coupled to an output terminal and to a load device. Each of the four quadrants of N MOSFET detectors is shifted a quarter of a wavelength with respect to the succeeding one, so that when the acoustic wave pattern has propagated to the Nth bit, and the MOSFET for a particular bit in a particlular quadrant is selected (by the control and code selection circuitry), corresponding to the phase-coded information for that bit, the AC current variation will add in phase with the current variations of other correctly selected MOSFET detectors for other of the N bits. If all N detectors are correctly selected, a large current variation, equal to the sum of all N selected MOSFET detectors occurs in the signal conductor, inducing a corresponding voltage variation across the corresponding load device at the corresponding output terminal. Coding sequences are generally selected to give very little in-phase addition when the surface acoustic wave occupies a position other than under all N correctly selected detectors.

For the above-mentioned prior art quadraphase acoustic wave correlator, 4 N MOSFET detectors are required. The acoustic wave correlator of the present invention distinctly distinguishes over the prior art device by providing control and switching circuitry which permits the same function to be accomplished wherein only 2 N MOSFET detectors are required.

The reduction in the number of MOSFET detectors is achieved by unique switching and control circuitry, so that only two, rather than four rows of N MOSFET detectors are required. In the embodiment of the invention previously described with reference to the Figures, the first row of MOSFET detectors have their channel regions spaced an integral number of wavelengths apart. The drain electrodes of each MOSFET detector, for example MOSFET 94 in FIG. 3, are coupled to the source electrodes of two switching MOSFETs 96 and 98, which are driven by phase reversal inverter circuit 56. Thus, only one of the switching MOSFETs 96 and 98 is in the on condition at a given time. Since much unused substrate space generally exists between adjacent bit detectors, associated switches, inverters and other control circuitry can be fabricated in this unused space to conserve total device area. Care must be taken to position the channels of critical elements such as switches in locations which will reinforce the acoustically generated signal.

For the following discussion, assume that MOSFET detector 94 is the first bit of an N-bit acoustic wave correlator, as illustrated in FIG. 1. Also assume, for purposes of explanation of operation, that the sinusoidal input signal is phase-coded with a phase shift of zero radians for the first time frame. Also assume that the channel region of MOSFET 94 (referring to FIG. 3) is an integral number of wavelengths from transducer 16. Then, for recognition, MOSFET 94 will be selected, i.e., turned on. Then, a logical "1" level ($-V_{DD}$ volts or other appropriate value) is applied to control terminal 79. Switching MOSFET 96 is turned on, and switching MOSFET 98 is turned off, so that the current variation in detector MOSFET 94 will be gated to signal conductor 28 and to load device 74 (referring to FIG. 1), causing the voltage $V_{OUT}$ between output terminals 22 and 24 to be an in-phase representation of the input voltage signal $V_{IN}$ for a time period equal in length to the duration of one time frame. However, if MOSFET 96 is turned off, and MOSFET 98 is turned on, the acoustic wave induced current variation in MOSFET 94 will be instead gated to signal conductor 30 and through load device 76, causing the voltage $V_{OUT}$ between output terminals 22 and 24 to be $\pi$ radians out of phase with the input voltage $V_{IN}$ for a time period equal in duration to one time frame. Thus, it is seen that changing the logic level of the signal on control terminal 79 from a logical "1" to a logical "0" level has the same effect on the contribution of detector MOSFET 94 to the output correlation signal as shifting the position of MOSFET detector 94 by one-half of a wavelength, which, of course, corresponds to a phase shift of $\pi$ radians.

It can be seen that an in-phase contribution to the output correlation signal $V_{OUT}$ will be obtained for an input signal having its first time frame phase-coded with a phase shift of $\pi$ radians if a logical "0" (i.e., zero volts) is applied to control terminal 79. Similarly, according to the invention, the second row of detectors 38, 40, etc. in FIG. 1 also recognizes either one of two coded phases of a particular time frame of the input signal $V_{IN}$, if the correct logic levels corresponding to the coded input signals are applied to control terminals 84, 85, etc.

For example, if a logical "1" is applied to a control terminal 84, an in-phase contribution to the correlation signal $V_{OUT}$ will occur if for time frame 1 the phase coded input signal is shifted $\pi/2$ radians. Or, if a logical "0" is applied to control terminal 84, an in-phase contribution to the correlation signal $V_{OUT}$ will occur if for time frame 1 the phase-coded input signal is shifted 3 $\pi/2$ radians. Thus, it is seen that the N-bit quadraphase acoustic wave correlator of the invention requires only two N MOSFET detectors, compared with four N MOSFET detectors required for the prior art device. Thus, the two rows of detectors and control circuitry in FIG. 1 can recognize a coded pattern of the input signal, where information is coded by four different phase shifts of the carrier signal, i.e., 0, $\pi/2$, $\pi$, and 3 $\pi/2$ radians.

It will be recognized that the principle of the invention can be applied to a bi-phase acoustic wave correlator device or to a six-phase or an eight-phase device, etc.

In summary, a decrease in the size of the silicion substrate is achieved according to the invention, resulting in lower cost devices. Further, it can be seen that additional advantages in aligning the MOSFET detector arrays relative to the position of the transducer are achieved, since the detector array may be placed on one side only of the transducer. Further, as is clear from the embodiment shown in FIG. 6, the drain capacitance of the unselected detector MOSFETs can be effectively decoupled from the signal lines, improving the high frequency performance. Also, fewer external connections (2 rather than 4) are needed to select a particular phase for a particular bit. A penalty is paid for the addition of MOSFET switches because they add additional resistance and capacitance to the circuit. They are useful in cases where a plurality of detectors as shown in FIG. 4 are used since the capacitance of many devices can be decoupled by a simple device of approximately equal capacitance. When an even number of detectors is used at a given phase of a given bit, the source elements of the switches can be made identical with two detector drains thereby minimizing parasitic switch capacitance contributions.

While the invention has been disclosed and described with reference to particular embodiments thereof, those skilled in the art will recognize that variations in placement and arrangement of parts may be made to suit various requirements within the true spirit and scope of the invention.

What is claimed is:

1. In an acoustic wave correlator device on a substrate including first and second input conductors on a surface of said acoustic wave correlator device, first and second voltage conductors a piezoelectric transducer on said surface coupled to said input conductors, a plurality of control terminals coupled to a control circuit, a plurality of switching circuits each including first and second electron control switches, a plurality of piezoresistive detectors in said acoustic wave correlator device, each of said piezoresistive detectors having first and second main electrodes and a control electrode, and being spaced any integral number of wavelengths from another of said piezoresistive detectors, and being coupled to one of said first and one of said second electron control switches, each of said electron control switches having first and second main electrodes and a control electrode, said first main electrode of each of said piezoresistive detectors being coupled to said second voltage conductor, said second main electrode of each of said piezoresistive detectors being coupled to said first main electrode of said first and second electron control switches coupled thereto, said second main electrode of each of said first electron control switches being coupled to said first signal conductor, and a second main electrode of each of said second electron control switches being coupled to said second signal conductor, said control electrodes of each of said first electron control switches being coupled, respectively, to one of said control terminals, circuitry comprising:

first and second signal conductors on said surface;

a plurality of phase reversal circuits, each having an input terminal and an output terminal, said output terminal of each of said phase reversal circuits being coupled, respectively, to said control electrode of one of said second electron control switches, and said input conductor of each of said phase reversal circuits being coupled, respectively, to one of said control terminals; and said control electrodes of each of said piezoresistive detectors being coupled, respectively, to one of said control terminals.

2. The circuitry as recited in claim 1 wherein each of said piezoresistive detectors includes an insulated gate field effect transistor, said first and second main electrodes thereof being source and drain electrodes and each of said gate electrodes thereof being a gate electrode.

3. The circuitry as recited in claim 2 wherein each of said insulated gate field effect transistor is spaced an integral number of wavelengths from another of said of insulated gate field-effect transistors.

4. The circuitry as recited in claim 1 wherein each of saíd electron control switches is an insulated gate field effect transistor, and each of said first and second main electrodes are source and drain electrodes, respectively, and each of said control electrodes is a gate electrode.

5. The circuitry as recited in claim 1 wherein each of said phase reversal circuits comprises an inverter having an input terminal and an output terminal, said input terminal and said output terminal being coupled, respectively, to said gate electrodes of one of said first and one of said second electron control switches.

6. The circuitry as recited in claim 5 wherein said inverter is an insulated gate field effect transistor inverter comprising first and second insulated gate field effect transistors coupled in series between said first and second voltage conductors, said input terminal of said inverter being connected to a gate of said second second insulated gate field-effect transistor and said output of said inverter being connected to a drain of said second insulated gate field-effect transistor.

7. The circuitry as recited in claim 1 wherein wherein said acoustic wave correlator device is a four-phase acoustic wave correlator device, said piezoresistive detectors being arranged on said surface in first and second rows on a first side of said transducer means, said piezoresistive detector means in said first row being positioned to be one-quarter wavelength out of phase with said piezoresistive detector means in said second row.

8. The circuitry as recited in claim 1 further including first and second load devices coupled, respectively, between said first and second signal conductors and said second voltage conductor.

* * * * *